(12) United States Patent
Liu

(10) Patent No.: US 7,595,989 B2
(45) Date of Patent: Sep. 29, 2009

(54) HEAT DISSIPATION DEVICE

(75) Inventor: Peng Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 1 day.

(21) Appl. No.: 11/955,314

(22) Filed: Dec. 12, 2007

(65) Prior Publication Data

US 2009/0154103 A1 Jun. 18, 2009

(51) Int. Cl.
*H05K 7/20* (2006.01)
*F28F 7/00* (2006.01)

(52) U.S. Cl. .............. 361/700; 165/80.2; 165/104.33; 361/704; 361/703

(58) Field of Classification Search .............. 361/697, 361/700; 165/104.33
See application file for complete search history.

(56) References Cited

U.S. PATENT DOCUMENTS

| | | | | |
|---|---|---|---|---|
| 7,269,014 B1 * | 9/2007 | Zhao et al. | ............... | 361/700 |
| 7,278,470 B2 * | 10/2007 | Xia et al. | ............... | 165/104.33 |
| 7,443,677 B1 * | 10/2008 | Zhou et al. | ............... | 361/702 |
| 2005/0141198 A1 * | 6/2005 | Lee et al. | ............... | 361/700 |
| 2006/0054307 A1 * | 3/2006 | Lee et al. | ............... | 165/80.3 |
| 2007/0000646 A1 * | 1/2007 | Chen et al. | ............... | 165/104.33 |
| 2008/0078588 A1 * | 4/2008 | Draper et al. | ............... | 177/145 |
| 2008/0121371 A1 * | 5/2008 | Zhou et al. | ............... | 165/80.3 |
| 2008/0128111 A1 * | 6/2008 | Zhou et al. | ............... | 165/80.3 |
| 2008/0316707 A1 * | 12/2008 | Liu | ............... | 361/700 |
| 2009/0000768 A1 * | 1/2009 | Zheng et al. | ............... | 165/80.3 |

* cited by examiner

*Primary Examiner*—Gregory D Thompson
(74) *Attorney, Agent, or Firm*—Frank R. Niranjan

(57) ABSTRACT

A heat dissipation device includes a base, a first heat sink located on the base, a second heat sink located on the first heat sink, and a heat pipe contacting with the base and the first and second heat sink. The first heat sink includes a heat spreader and a plurality of fins extending from the heat spreader. The second heat sink includes a heat spreader and a plurality of fins extending from the heat spreader. The heat pipe includes an evaporating portion, first and second condensing portions parallel to the evaporating portion and first and second connecting portions interconnecting corresponding first and second condensing portion and the evaporating portion. The evaporating portion and the first condensing portion are located between the base and the heat spreader of the first heat sink. The second condensing portion is located on the heat spreader of the second heat sink.

11 Claims, 3 Drawing Sheets

HEAT DISSIPATION DEVICE

BACKGROUND OF THE INVENTION

1. Field of the Invention

The present invention relates to a heat dissipation device adapted for removing heat from electronic devices, and more particularly to a heat dissipation device incorporating heat pipes for improving heat dissipation efficiency of the heat dissipation device.

2. Description of Related Art

During operation of an electronic device such as computer central processing units (CPUs), a large amount of heat is often generated. The heat must be quickly removed from the CPU to prevent it from becoming unstable or being damaged. Typically, a heat dissipation device is attached to an outer surface of the CPU to absorb heat from the CPU. The heat absorbed by the heat dissipation device is then dissipated to ambient air.

Conventionally, a heat dissipation device may includes a fin-type heat sink. A conventional heat sink is made of highly heat-conductive metal, such as copper or aluminum, and generally includes a base portion for contacting the electronic device to absorb heat therefrom and a plurality of fins formed on the base portion for dissipating heat. However, as the operation speed of electronic devices has been continually upgraded, these kinds of conventional heat sinks can no longer meet the heat dissipation requirements of modern IC packages. Nowadays, heat pipes have been widely used due to their great heat-transferring capability. According, heat sinks equipped with heat pipes are devised in various manners.

A typical heat dissipation device incorporating a plurality of heat pipes includes a fin-typed heat sink. The heat sink includes a base for contacting an electronic device and a plurality of fins arranged on the base. The fins are combined together by soldering or other means. The base defines a plurality of grooves therein. The fins cooperatively define a plurality of through holes therein. Each heat pipe has a substantially straight evaporating portion received in a corresponding groove of the base, and a straight condensing portion received in a corresponding through hole of the fins. The heat generated by the electronic device is absorbed by the base, and transferred from the base to the fins via the heat pipes, and finally dissipated from the fins to ambient air. However, a manufacturing and assembly process of such fin-typed heat sinks is troublesome and time-consuming, which accordingly increases the cost of the heat dissipation device.

What is needed, therefore, is an improved heat dissipation device which can overcome the above problems.

SUMMARY OF THE INVENTION

A heat dissipation device includes a base adapted for absorbing heat from an electronic device, a first heat sink located on the base, a second heat sink located on the first heat sink, and a heat pipe thermally contacting with the base and the first and second heat sink. The first heat sink comprises a heat spreader and a plurality of fins extending from a surface of the heat spreader. The second heat sink comprises a heat spreader with a bottom surface thereof contacting with the fins of the first heat sink and a plurality of fins extending from a surface of the heat spreader. The heat pipe comprises an evaporating portion, first and second condensing portions parallel to the evaporating portion and first and second connecting portions interconnecting corresponding first and second condensing portion and the evaporating portion. The evaporating portion and the first condensing portion are located between the base and the heat spreader of the first heat sink, and the second condensing portion is located on the heat spreader of the second heat sink.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
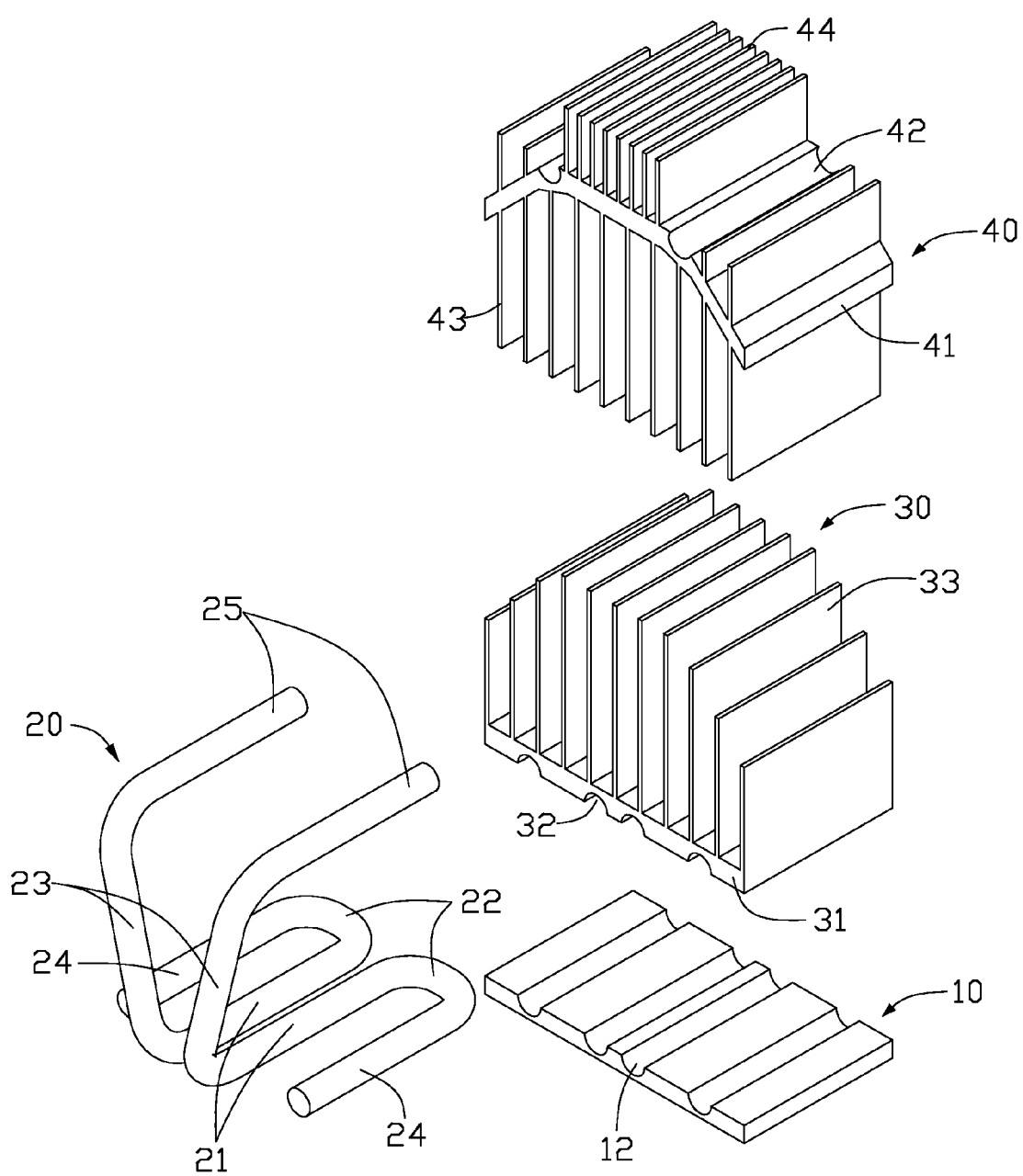
FIG. 1 is an exploded, isometric view of a heat dissipation device in accordance with a preferred embodiment of the present invention.

Referring to FIG. 1, a heat dissipation device in accordance with a preferred embodiment of the present invention is mounted on a printed circuit board (not shown) to remove heat from a heat-generating electronic device (not shown) such as a CPU mounted on the printed circuit board. The heat dissipation device comprises a base 10, a first heat sink 30 arranged on the base 10, a second heat sink 40 located on the first heat sink 30, and two heat pipes 20 thermally connecting the base 10, the first and second heat sinks 30, 40.

The base 10 is made of a material having high heat conductivity, such as copper or aluminum. The base 10 is a rectangular flat plate. A bottom surface of the base 10 contacts with the heat-generating electronic device to absorb heat generated from the heat-generating electronic device. The electronic device is substantially positioned at a middle portion of the bottom surface of the base 10. Four parallel semi-cylindrical grooves 12 are defined at a top surface of the base 10 for receiving parts of the heat pipes 20. Two of the grooves 12 are spaced close together and positioned at a substantially middle portion of the base 10. The other two grooves 12 are positioned at two opposite flanks of the two closer grooves 12.

The two heat pipes 20 have essentially identical configurations, as well as having essentially identical functions. Each of the heat pipes 20 has a horizontal, straight evaporating portion 21. A first connecting portion 22 horizontally extends from one end of the evaporating portion 21. A second connecting portion 23 vertically and upwardly extends from the other end of the evaporating portion 21. The second connecting portion 23 has a height similar to that of the first heat sink 30. A first condensing portion 24 horizontally extends from an end of the first connecting portion 22 and towards the second connecting portion 23. The first condensing portion 24 is parallel to the evaporating portion 21. The first condensing portion 24, the first connecting portion 22 and the evaporating portion 21 cooperatively form a U-shaped configuration, which has an opening oriented towards a first direction. A second condensing portion 25 horizontally extends from an end of the second connecting portion 23 and extends towards the first connecting portion 22. The second condensing portion 25, the second connecting portion 23 and the evaporating portion 21 cooperatively form another U-shaped configuration, which has an opening oriented towards a second direction opposite to the first direction. The two U-shaped configurations of the heat pipe 20 are in two planes with an acute angle defined therebetween. The two heat pipes 20 are arranged symmetrically with the two evaporating portions 21 positioned closer together relative to the two second condensing portions 25.

The first heat sink 30 is made of a material having high heat conductivity, such as copper or aluminum, and comprises a heat spreader 31 and a plurality of fins 33 extending from a top surface of the heat spreader 31. The heat spreader 31 is a rectangular flat plate and has an identical profile area with the base 10. Corresponding to the four grooves 12 on the base 10, four semi-cylindrical grooves 32 are defined at a bottom surface of the heat spreader 31. The fins 33 are parallel to the grooves 32 and parallel to each other, and a distance is defined between every two adjacent fins 33. The fins 33 has a trapezoid-shaped profile, i.e., the fins 33 located at a middle portion of the heat spreader 31 being higher than the other fins 33 located at two opposite sides of the heat spreader 31. The height of the second connecting portions 23 of the heat pipes 20 is similar to that of the middle fins 33.

The second heat sink 40 comprises a heat spreader 41, a plurality of first fins 43 extending downwardly from a bottom surface of the heat spreader 41, and a plurality of second fins 44 extending upwardly from a top surface of the heat spreader 41. The heat spreader 41 has a corresponding profile relative to a top of the fins 33 of the first heat sink 30 to cover the top of the fins 33, i.e., two lateral sides of the heat spreader 41 are bended downwardly. Two grooves 42 are defined at the top surface of the heat spreader 41 at two bended portions thereof for receiving the second condensing portions 25 of the two heat pipes 20. The first fins 43 are parallel to each other and a distance is defined between every two adjacent first fins 43. The distance is identical to that between every two adjacent fins 33 of the first heat sink 30. The second fins 44 are parallel to the first fins 43 of the second heat sink 40 and the fins 33 of the first heat sink 30. The second fins 44 are shorter than the first fins 43. Parts of the second fins 44 at a middle portion of the heat spreader 41 are spaced closer than parts of the second fins 44 at two lateral sides of the heat spreader 41.

Figure 2:
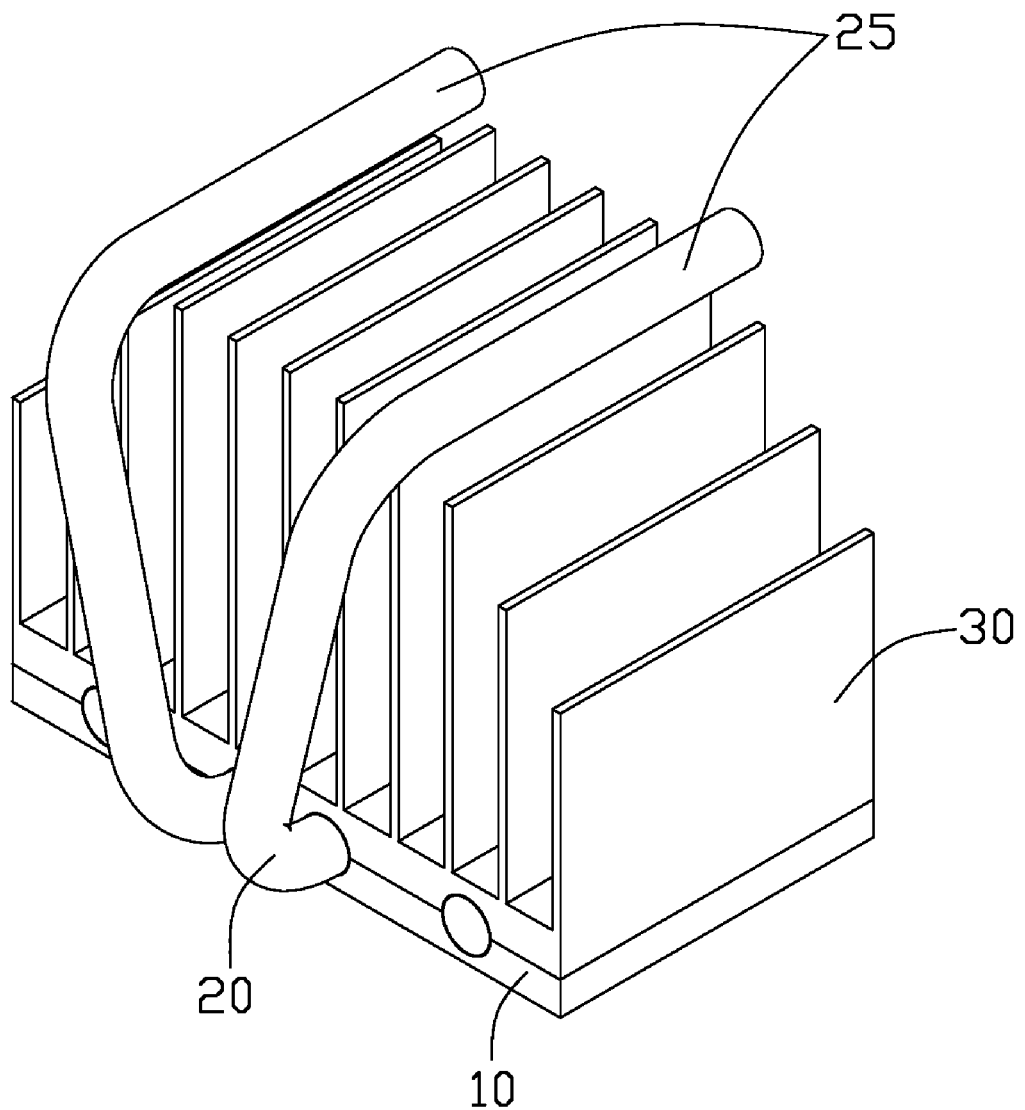
FIG. 2 is a partially assembled, isometric view of the heat dissipation device in FIG. 1.
Figure 3:
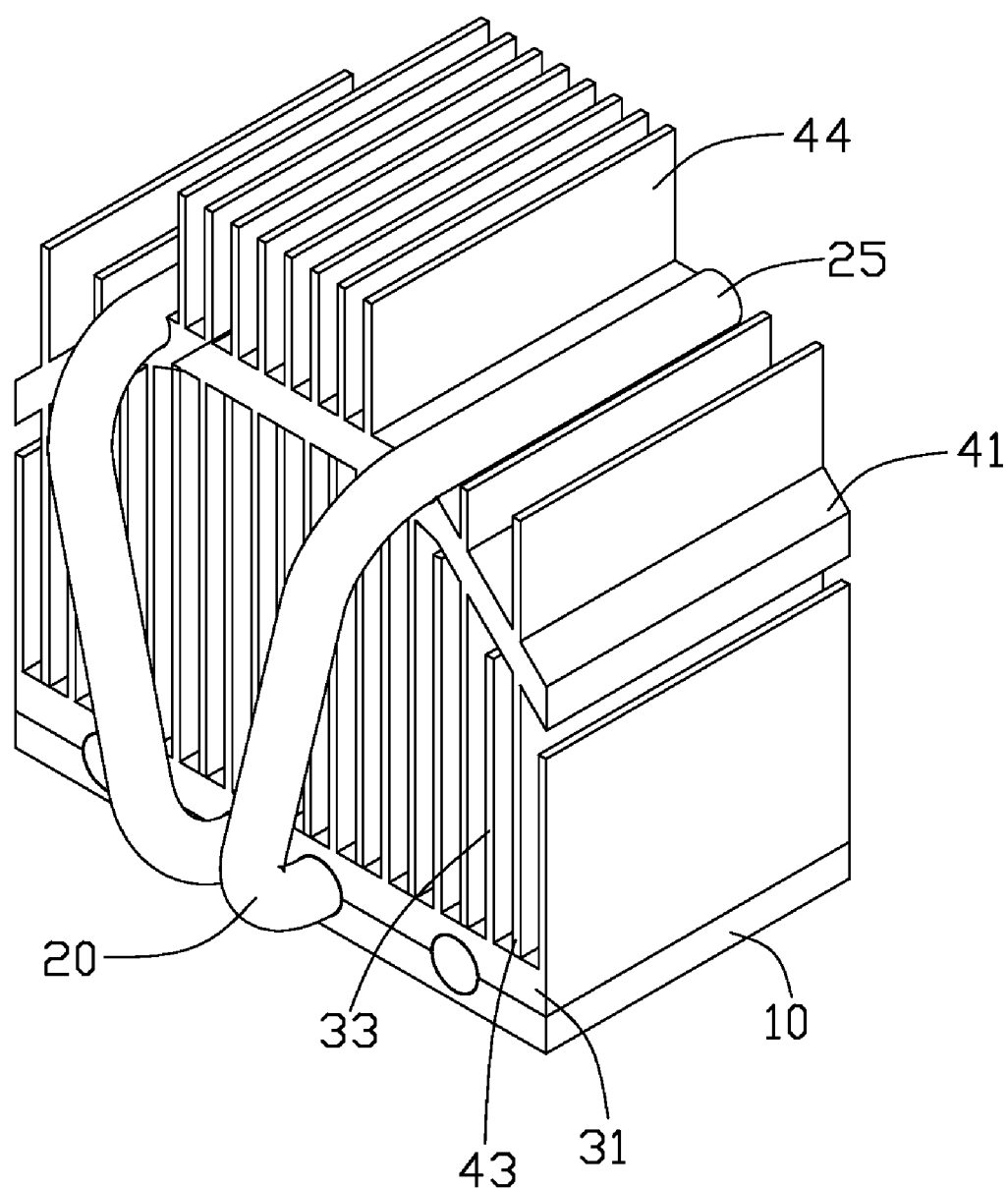
FIG. 3 is an assembled view of the heat dissipation device in FIG. 1.

Referring to FIG. 2 and FIG. 3, in assembly, firstly, the evaporating portions 21 and the first condensing portions 24 of the two heat pipes 20 are received in the grooves 12 of the base 10. The evaporating portions 21 are received in the two grooves 12 at the middle portion of the base 10. The first condensing portions 24 are received in the two lateral grooves 12 of the base 10.

Secondly, the first heat sink 30 is arranged on the base 10. The grooves 12 on the base 10 and the grooves 32 on the heat spreader 31 of the first heat sink 30 cooperatively define four cylindrical holes for receiving the evaporating portions 21 and the first condensing portions 24 of the heat pipes 20. Thus, the evaporating portions 21 and the first condensing portions 24 of the heat pipes 20 are sandwiched between the base 10 and the first heat sink 30. The first connecting portions 22 and the second connecting portions 23 of the heat pipes 20 are positioned in an external space of the first heat sink 30 at a front and a rear side thereof, respectively. The second condensing portions 25 of the two heat pipes 20 are located above the fins 33 of the first heat sink 30.

Thirdly, the second heat sink 40 is arranged on the first heat sink 30. The first fins 43 of the second heat sink 40 and the fins 33 of the first heat sink 30 are distributed in alternating fashion. In other words, each of the first fins 43 of the second heat sink 40 is arranged between every two adjacent fins 33 of the first heat sink 30. Free ends of the first fins 43 of the second heat sink 40 contact with the top surface of the heat spreader 31 of the first heat sink 30. The second condensing portions 25 of the two heat pipes 20 are received in the two grooves 42 on the heat spreader 41, respectively. In this way the assembly of the heat dissipation device is completed.

In operation, heat produced by the electronic device is firstly absorbed by the base 10, then a part of heat of the base 10 is directly conducted to the first heat sink 30, and then dissipated to atmosphere. Another part of the heat of the base 10 is conducted to the evaporating portions 21 of the heat pipes 20. Then, the heat absorbed by the evaporating portions 21 is transferred horizontally to the first condensing portions 24 and upwardly to the second condensing portions 25 along the first connecting portions 22 and the second connecting portions 23, respectively. As is known, the heat generated by the electronic device is mostly focused in the middle portion of the base 10. The heat can be quickly transferred to two lateral sides of the base 10 via the first condensing portions 24 of the heat pipes 20, for fully exploiting the heat dissipating area of the base 10 and the heat spreader 31 of the first heat sink 30. The heat transferred to the second condensing portions 25 can be further conducted to the second heat sink 40 and then dissipated to atmosphere.

It is noticeable that, as the free ends of the first fins 43 of the second heat sink 40 contact with the heat spreader 31 of the first heat sink 30, the heat absorbed by the first heat sink 30 can be transferred to the second heat sink 40 via the first fins 43 thereof. Furthermore, as the fins 33 of the first heat sink 30 and the first fins 43 of the second heat sink 40 are distributed in alternating fashion, an amount of the fins can be increased. Thus, the heat dissipating areas of the heat dissipation device are increased. Moreover, the bended heat spreader 41 of the second heat sink 40 can reduce the heat conducting paths between the second condensing portions 25 and the first fins 43 at two lateral sides of the second heat sink 40, thus, the heat can be more quickly transferred from the second condensing portions 25 to the free ends of the first fins 43 at two lateral sides of the second heat sink 40.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device for removing heat from a heat generating electronic device, comprising:
  a base adapted for absorbing heat from the electronic device;
  a first heat sink located on the base, the first heat sink comprising a heat spreader and a plurality of fins extending from a surface of the heat spreader;
  a second heat sink located on the first heat sink, the second heat sink comprising a heat spreader with a bottom surface thereof contacting with the fins of the first heat sink and a plurality of fins extending from a surface of the heat spreader; and
  a heat pipe thermally contacting with the base, the first heat sink and the second heat sink, the heat pipe comprising an evaporating portion, first and second condensing portions parallel to the evaporating portion and first and second connecting portions interconnecting corresponding first and second condensing portion and the evaporating portion, the evaporating portion and the first condensing portion located between the base and the heat spreader of the first heat sink, the second condensing portion located on the heat spreader of the second heat sink.

2. The heat dissipation device as claimed in claim 1, wherein the fins of the second heat sink comprises a plurality of first fins and second fins, the first fins extend from the bottom surface of the heat spreader of the second heat sink toward the heat spreader of the first heat sink, the second fins extend from a top surface of the heat spreader of the second fins, the first fins of the second heat sink and the fins of the first heat sink are distributed in alternating fashion.

3. The heat dissipation device as claimed in claim 2, wherein free ends of the first fins of the second heat sink contact with the heat spreader of the first heat sink.

4. The heat dissipation device as claimed in claim 2, wherein the fins of the first heat sink and the first and second fins of the second heat sink are parallel to each other.

5. The heat dissipation device as claimed in claim 1, wherein the fins of the first heat sink have a trapezoid-shaped profile in which the fins located at a middle portion of the heat spreader of the first heat sink being higher than the other fins located at two opposite sides of the heat spreader of the first heat sink, two lateral sides of the heat spreader of the second heat sink are bended downwardly corresponding to the profile of the fins of the first heat sink.

6. The heat dissipation device as claimed in claim 1, wherein the evaporating portion of the heat pipe is located at a substantially middle portion of the base, and the first condensing portion of the heat pipe is located beside the evaporating portion.

7. The heat dissipation device as claimed in claim 1, wherein the base and the heat spreader of the first heat sink define a plurality of grooves cooperatively for receiving the evaporating portion and the first condensing portion of the heat pipe, the heat spreader of the second heat sink defines a groove for receiving the second condensing portion of the heat pipe.

8. The heat dissipation device as claimed in claim 1, further comprising an additional heat pipe being symmetrically arranged at a flank of the heat pipe, the additional heat pipe and the heat pipe have a same structure, an evaporating portion and a first condensing portion of the additional heat pipe are located between the base and the heat spreader of the first heat sink, and a second condensing portion of the additional heat pipe is located on the heat spreader of the second heat sink.

9. A heat dissipation device, comprising:
a base plate;
a heat sink having a first heat spreader;
another heat sink having a second heat spreader over the first heat spreader, a plurality of first fins extending from the heat sink and sandwiched between the first heat spreader and the second heat spreader, a plurality of second fins extending from the another heat sink and sandwiched between the first spreader and the second spreader; and
a heat pipe having a u-shaped first section sandwiched between the base plate and the first heat spreader of the heat sink, and a straight second section connecting with the first section via a connecting section, the second section mounted on the second heat spreader, the connecting section located at a side of the first and second fins.

10. The heat dissipation device as claimed in claim 9, wherein two opposite lateral sides of the second heat spreader of the another heat sink extend obliquely and downwardly in a manner such that the first fins located at a middle of the heat sink have higher heights than the first fins located at two opposite lateral sides of the heat sink.

11. The heat dissipation device as claimed in claim 10, wherein a plurality of additional fins extend upwardly from a top of the second heat spreader of the another heat sink.

* * * * *